United States Patent
Jansen et al.

(10) Patent No.: US 11,888,077 B2
(45) Date of Patent: Jan. 30, 2024

(54) PHOTOVOLTAIC MODULE WITH BACK CONTACT FOIL

(71) Applicant: Nederlandse Organisatie voor toegepast-natuurwetenschappelijk Onderzoek TNO, 's-Gravenhage (NL)

(72) Inventors: Markus Johan Jansen, 's-Gravenhage (NL); Koen Maarten de Groot, 's-Gravenhage (NL); Jozef Cornelis Petrus Kester, 's-Gravenhage (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 512 days.

(21) Appl. No.: 16/336,151

(22) PCT Filed: Sep. 25, 2017

(86) PCT No.: PCT/NL2017/050636
§ 371 (c)(1),
(2) Date: Mar. 25, 2019

(87) PCT Pub. No.: WO2018/056822
PCT Pub. Date: Mar. 29, 2018

(65) Prior Publication Data
US 2021/0280728 A1 Sep. 9, 2021

(30) Foreign Application Priority Data
Sep. 26, 2016 (NL) ..................... 2017528

(51) Int. Cl.
*H01L 31/05* (2014.01)
*H01L 31/0224* (2006.01)

(52) U.S. Cl.
CPC .. *H01L 31/0516* (2013.01); *H01L 31/022441* (2013.01)

(58) Field of Classification Search
CPC . H01L 31/05; H01L 31/0504; H01L 31/0508; H01L 31/0516; H01L 31/022441; H01L 31/0465; H01L 31/0201
(Continued)

(56) References Cited

U.S. PATENT DOCUMENTS

| 4,045,245 A * | 8/1977 | Coleman | H01L 31/0508 136/251 |
| 2008/0142071 A1* | 6/2008 | Dorn | H01L 31/0504 136/244 |

(Continued)

FOREIGN PATENT DOCUMENTS

| EP | 2 423 973 A1 | 2/2012 | |
| EP | 2736081 A1 * | 5/2014 | H01L 31/0201 |

(Continued)

OTHER PUBLICATIONS

EP-2736081-A1 English machine translation (Year: 2014).*
WO-2012171679-A1 English machine translation (Year: 2012).*

*Primary Examiner* — Andrew J Golden
(74) *Attorney, Agent, or Firm* — N.V. Nederlandsch Octrooibureau

(57) ABSTRACT

A photovoltaic module (1) with a plurality of photovoltaic units (3) each having a positive contact terminal (8) and a negative contact terminal (7), and a single layer back contact substrate (4). The back contact substrate (4) has a positive surface part (6) electrically connected to the positive contact terminal (8) of each of the plurality of photovoltaic units (3), and a negative surface part (5) electrically connected to the negative contact terminal (7) of each of the plurality of photovoltaic units (3). The photovoltaic module (1) further has at least one contact bridge (9a, 9b) in a layer of the photovoltaic module (1) outside of the single layer back (Continued)

contact substrate (4), which provides an electrical connection in the negative surface part (5) and/or in the positive surface part (6).

18 Claims, 9 Drawing Sheets

(58) Field of Classification Search
USPC .................................................. 136/243–265
See application file for complete search history.

(56) References Cited

U.S. PATENT DOCUMENTS

| | | | |
|---|---|---|---|
| 2009/0283141 A1* | 11/2009 | Bentzen | H01L 31/022425 |
| | | | 136/256 |
| 2011/0140532 A1* | 6/2011 | Cherukupalli | H01L 31/0508 |
| | | | 307/77 |
| 2012/0060895 A1* | 3/2012 | Rubin | H01L 31/0504 |
| | | | 136/246 |
| 2015/0194547 A1 | 7/2015 | Moslehi | |
| 2015/0287865 A1* | 10/2015 | Aiken | H01L 31/0508 |
| | | | 136/251 |

FOREIGN PATENT DOCUMENTS

| | | | | |
|---|---|---|---|---|
| WO | WO-8905521 A1 * | 6/1989 | ......... | H01L 31/0504 |
| WO | WO-2012171679 A1 * | 12/2012 | ......... | H01L 31/0516 |
| WO | 2015/150471 A1 | 10/2015 | | |
| WO | 2016/028825 A1 | 2/2016 | | |
| WO | 2016/036892 A1 | 3/2016 | | |

* cited by examiner

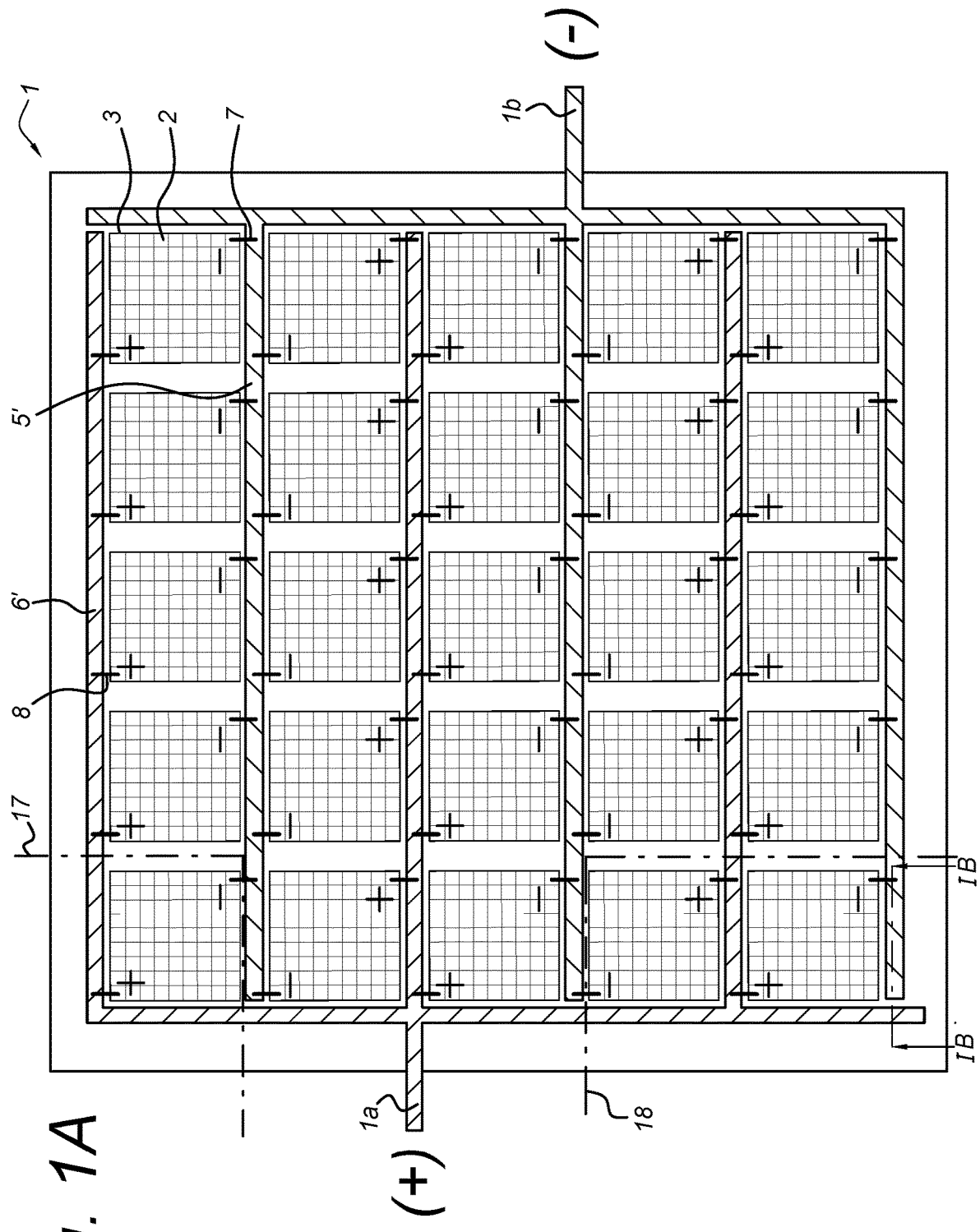

PHOTOVOLTAIC MODULE WITH BACK CONTACT FOIL

FIELD OF THE INVENTION

The present invention relates to a photovoltaic module, in particular a photovoltaic (PV) module provided with a back contact foil. More specifically, the present invention relates to a photovoltaic module comprising a plurality of photovoltaic units each having a positive contact terminal and a negative contact terminal, and a single layer back contact substrate. The single layer back contact substrate comprises a positive surface part electrically connected to the positive contact terminal of each of the plurality of photovoltaic units, and a negative surface part electrically connected to the negative contact terminal of each of the plurality of photovoltaic units,

BACKGROUND ART

The international application WO2015/150471 discloses an interdigitated back contact photovoltaic module comprising a negative terminal and a positive terminal, and a parallel connection of m sub-modules connected to the negative and the positive terminal of the photovoltaic module. Each of the m sub-modules comprises a string of n series-connected back contact cells, wherein the n cells of each sub-module are arranged in an array. The parallel connection and connections for each string of n series-connected back contact cells are provided in a back conductive sheet, wherein the back conductive sheet comprises designated areas for the parallel connections corresponding to edge parts of each corresponding sub-module.

European patent publication EP-A-2 423 973 discloses a wiring sheet 10 having wirings provided on an insulating base material 11 for electrically connecting back surface electrode type solar cells 20 each having first conductivity type electrodes 24 and second conductivity type electrodes 25 arranged on one surface of a semiconductor substrate 21. The wirings have a cell arrangement portion 19 on which the back surface electrode type solar cell 20 is to be arranged, and a plurality of the cell arrangement portions are aligned on the insulating base material 11 in a first direction and in a second direction which is different from the first direction.

SUMMARY OF THE INVENTION

The present invention seeks to provide an improved photovoltaic module which is easy to manufacture, and allows easy adaption of a shape of the photovoltaic module without reducing the efficiency of the photovoltaic module.

According to the present invention, a photovoltaic module as defined above is provided, wherein the photovoltaic module further comprises at least one contact bridge in a layer of the photovoltaic module outside of the single layer back contact substrate, the at least one contact bridge providing an electrical connection in the negative surface part and/or in the positive surface part. This allows to provide a photovoltaic module which is easy to manufacture (due to the single layer back contact substrate), yet the form of which can be adapted at will without sacrificing unnecessary effective frontal surface of the photovoltaic module. A differently sized photovoltaic module may be provided without having to redesign the electrical layout of the back contact substrate, which will save time and costs.

SHORT DESCRIPTION OF DRAWINGS

The present invention will be discussed in more detail below, with reference to the attached drawings, in which FIG. 1A shows a schematic view of a PV module according to a prior art implementation, and FIG. 1B shows a partial cross sectional view of the PV module of FIG. 1A along the line IB-IB;

DESCRIPTION OF EMBODIMENTS

This invention relates to photovoltaic (PV) modules employing a single layer back contact substrate, e.g. in the form of a foil with a patterned metal layer. The present invention embodiments provide an alternative interconnection design for such conducting foil based solar panels that makes it possible to cut the PV module into several pieces and retrieve several working pieces with same basic specifications (e.g. output voltage) as the original.

Figure 1B:
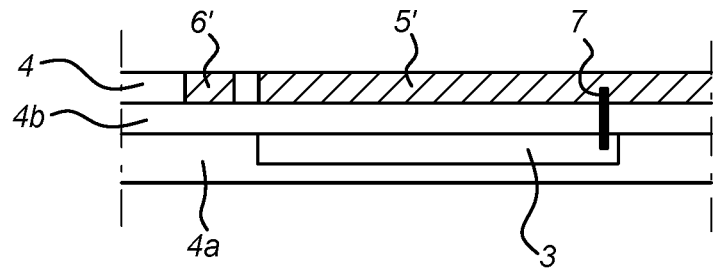

A prior art PV module is shown schematically in the view of FIG. 1A and in the partial cross sectional view of FIG. 1B (along the line IB-IB in FIG. 1A). This PV module 1 comprises a number of PV units 3, wherein each PV unit 3 has a plurality of photovoltaic cells 2 (the units 3 as shown have 9×9 PV cells 2) which are series connected in a string. Each PV unit 3 has one positive output terminal 8 and one negative output terminal 7 at the back side of the PV unit 3. The positive output terminals 8 of all PV units 3 are connected to a positive module terminal 1a via positive conductive fingers 6', and the negative output terminals 7 of all PV units 3 are connected to a negative module terminal 1b via negative conductive fingers 5'. The positive and negative conductive fingers 6', 5' are part of a back contact substrate 4, and form an interdigitated pattern. Note that the positive and negative conductive fingers 6', 5' may be arranged as wider current paths of the back contact substrate 4, and may overlap the PV units 3 partly or completely. In the cross sectional view of FIG. 1B, it is shown that the conductive fingers 6', 5' are part of the conductive back contact substrate 4, which is electrically isolated from the PV unit 3 in a front layer 4a of the PV module 1 by an isolating layer 4b. The isolating layer 4b can be an adhesive layer to bond the conductive back contact substrate 4 to the front layer 4a. The back side contact terminals (positive output terminal 8 shown in FIG. 1B) extend to the conductive back contact substrate 4 for providing the electrical contacts.

A problem arises when the shape of the PV module 1 needs to be altered, e.g. by taking away three PV units 3 from the PV module 1 as e.g. indicated by lines 17 and 18 in FIG. 1A. Such a modification would sever the connection to the positive module terminal 1a of the entire top row of PV units 3, as well as of the bottom two rows of PV units 3. Either additional measures have to be taken to reconnect the affected PV units 3, or an entire new design of the back contact substrate 4 needs to be made and implemented, which both would be time and resource consuming.

The present invention embodiments allow to have one or more PV units 3 of a PV module 1 to be taken out, without affecting proper operation of the PV module 1. To that end, the present invention provides a number of embodiments, which share the following features. The photovoltaic module 1 comprises a plurality of photovoltaic units 3 each having a positive contact terminal 8 and a negative contact terminal 7, and a single layer back contact substrate 4, e.g. in the form of a foil. The single layer back contact substrate 4 comprises a positive surface part 6 electrically connected to the positive contact terminal 8 of each of the plurality of photovoltaic units 3, and a negative surface part 5 electrically connected to the negative contact terminal 7 of each of the plurality of photovoltaic units 3. The photovoltaic module 1 further comprising at least one contact bridge 9a, 9b in a layer of the photovoltaic module 1 outside of the single layer back contact substrate 4, the at least one contact bridge 9a, 9b providing an electrical connection in the negative surface part 5 and/or in the positive surface part 6.

Figure 5:
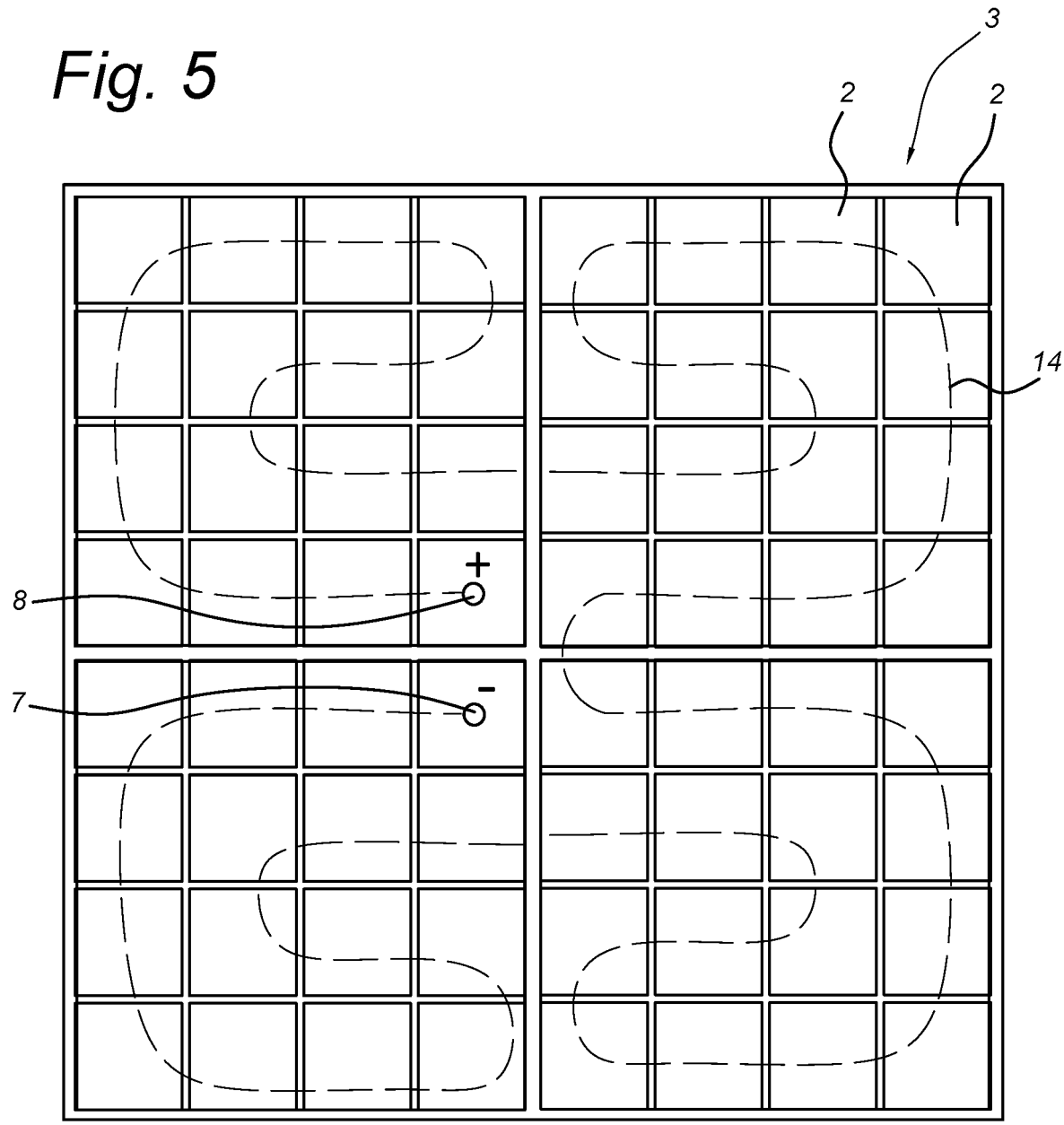
FIG. 5 shows a schematic view of a string implementation of an array of PV cells.

It is noted that in the present invention embodiments each of the photovoltaic units 3 may comprise a single photovoltaic cell 2, e.g. in the form of monocrystalline or polycrystalline cells 2 in a regular 6×10 arrangement. Alternatively, each of the photovoltaic units 3 may comprise a string of photovoltaic cells 2, as explained above in relation to FIG. 1A. FIG. 5 also shows an embodiment of a photovoltaic unit 3 which comprises a string of photovoltaic cells 2 in an 8×8 array. The positive contact terminal 8 and negative contact terminal 7 form the beginning and end of the string connection 14, and are located at the centre of the PV unit 3.

Figure 2:
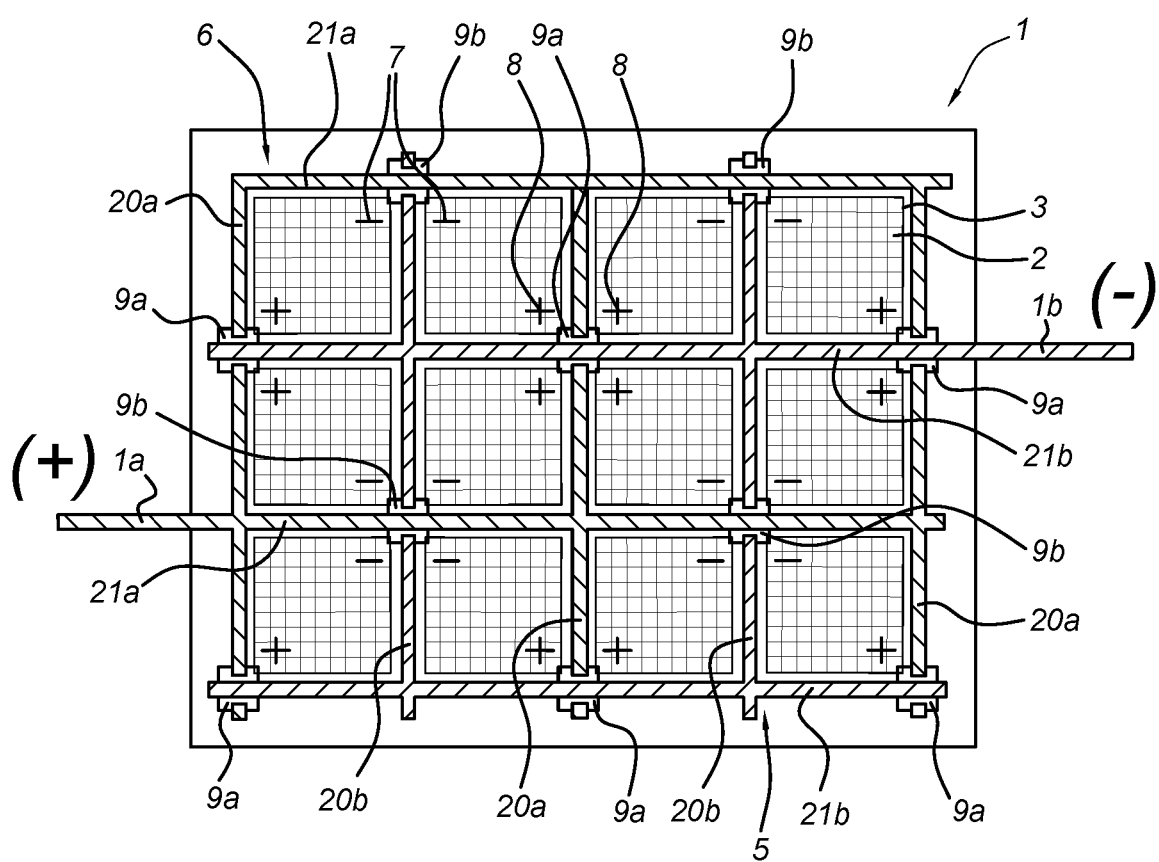
FIG. 2 shows a schematic view of a PV module with a back contact substrate, according to a first embodiment of the present invention.

FIG. 2 shows a view of a first practical embodiment of the present invention, wherein the positive surface part 6 is formed by a combination of vertical positive conductive lines 20a, horizontal positive conductive lines 21a, and positive contact bridges 9a (which are thus all electrically connected to the positive module terminal 1a). The negative surface part 5 is formed by a combination of vertical negative conductive lines 20b, horizontal negative conductive lines 21b, and negative contact bridges 9b (which are thus all electrically connected to the negative module terminal 1b). The PV units 3 are arranged in a pattern, such that the positive contact terminals 8 (and negative contact terminals 7) of each group of four adjacent PV units 3 are grouped together, allowing electrical connections to be made to the positive and negative contact bridges 9a, 9b, respectively. In this manner, an intermeshed pattern is formed of positive and negative grid lines which are mainly positioned in the back contact substrate 4: only the contact bridges 9a, 9b are in a different layer of the PV module 1. This ensures that even when a single PV unit 3 is removed from the PV module 1, connection to the remaining PV units 3 of the PV module 1 is maintained. There is no need whatsoever to redesign the back conductive substrate 4 or to apply additional contact leads.

As shown in the exemplary embodiment of FIG. 2, the at least one contact bridge 9a, 9b is located within a perimeter of the PV module 1, e.g. even within the perimeter of the back contact substrate 4. This implies that the at least one contact bridge 9a, 9b overlays the area of the PV module 1 where the PV units 3 are present. By making the contact bridges 9a, 9b locally, no complex processing is needed during manufacturing of the PV module 1.

All the present invention embodiment provide the advantage that a fixed voltage is present, no matter which or how many of the PV units 3 are removed from the PV module 1 design. The current which can potentially be provided is dependent on the PV module 1 area. It is thus possible to cut the PV module 1 to any size/shape, only changing the maximum current output. In an analogue manner, also shading of a PV module 1 during operation is less severe, as the fixed voltage remains, and the current provided depends on the dimensions of the shaded area. An even further advantage of the grid like implementation of the positive and negative surface parts 6, 5, is that the electrical connection of the PV module 1 (i.e. positive and negative module terminals 1a, 1b) can be placed at any point around the perimeter of the PV module 1. The PV module 1 according to the present invention embodiments is thus a true "form free" PV module, as the PV module 1 can be cut to any form without redesigning the backside contact substrate 4.

Figure 3:
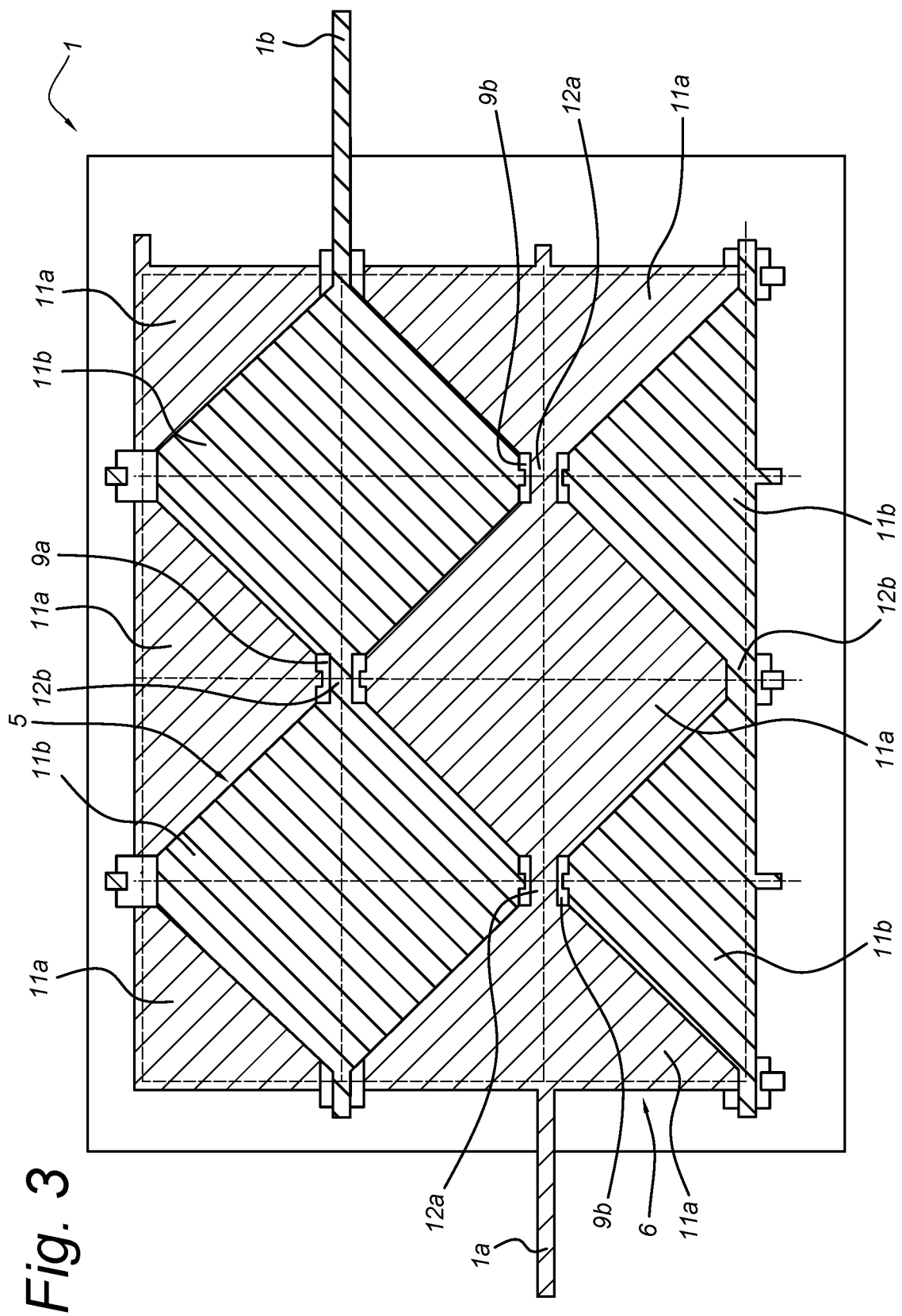
FIG. 3 shows a schematic view of a further embodiment of a PV module with a back contact substrate according to the present invention.

FIG. 3 shows a further embodiment of the present invention PV module 1, having a 3×4 array of PV units 3 (indicated by the dashed lines as the PV units 3 are below the back contact substrate 4). In this embodiment, the back contact substrate 4 again comprises a positive surface part 6, being a combination of diamond shaped positive contact fields 11a and a number of interconnecting lines 12a, and a negative surface part 5, being a combination of also diamond shaped negative contact fields 11b and a number of interconnecting lines 12b. In the embodiment shown in FIG. 3, the positive module terminal 1a is connected to the positive surface part 6, implemented as a left to right sequence of positive contact field 11a and interconnecting line 12a (similar for the negative module terminal 1b). To provide the grid like pattern of positive/negative contact fields 11a, 11b, furthermore, at least one contact bridge 9a, 9b is present, in the embodiment shown in all connecting points located above crossings of the underlying PV units 3. In all, the combination of positive and negative surface parts 6, 5 of the back contact substrate 4 is covering about the entire surface area of the PV module 1.

In the embodiments described with reference to FIGS. 2 and 3 above, but also for the following embodiments, the at least one contact bridge 9a, 9b cannot be implemented in the single layer back contact substrate 4. In a group of embodiments, therefore, the at least one contact bridge 9a, 9b comprises an electrically conductive connection member, e.g. in the form of a wire, a tab, a thin film conductive sheet, etc. In a specific example, the thin film conductive sheet can be of a plaster or patch type, which is easy to apply, e.g. using a (conductive) adhesive. The electrically conductive connection member then overlays the single layer back contact substrate 4.

In a further group of embodiments, each one of the plurality of photovoltaic units 3 is a rectangular cell, which allows easy manufacturing of the grid like pattern of the positive and negative surface part 6, 5. As shown in the embodiment of FIG. 3, the negative surface part 5 and/or positive surface part 6 may comprise a plurality of polygon shaped surface elements 11a, 11b. As shown in the embodiment of FIG. 3, diamond shaped surface elements are used, wherein each diamond shaped surface element lies over about half the surface area of a group of four adjacent PV cells. Furthermore, the polygon shaped surface elements 11a, 11b are interconnected by a line part 12a, 12b in the single layer back contact substrate 4, or by the at least one contact bridge 9a, 9b.

Figure 4A:
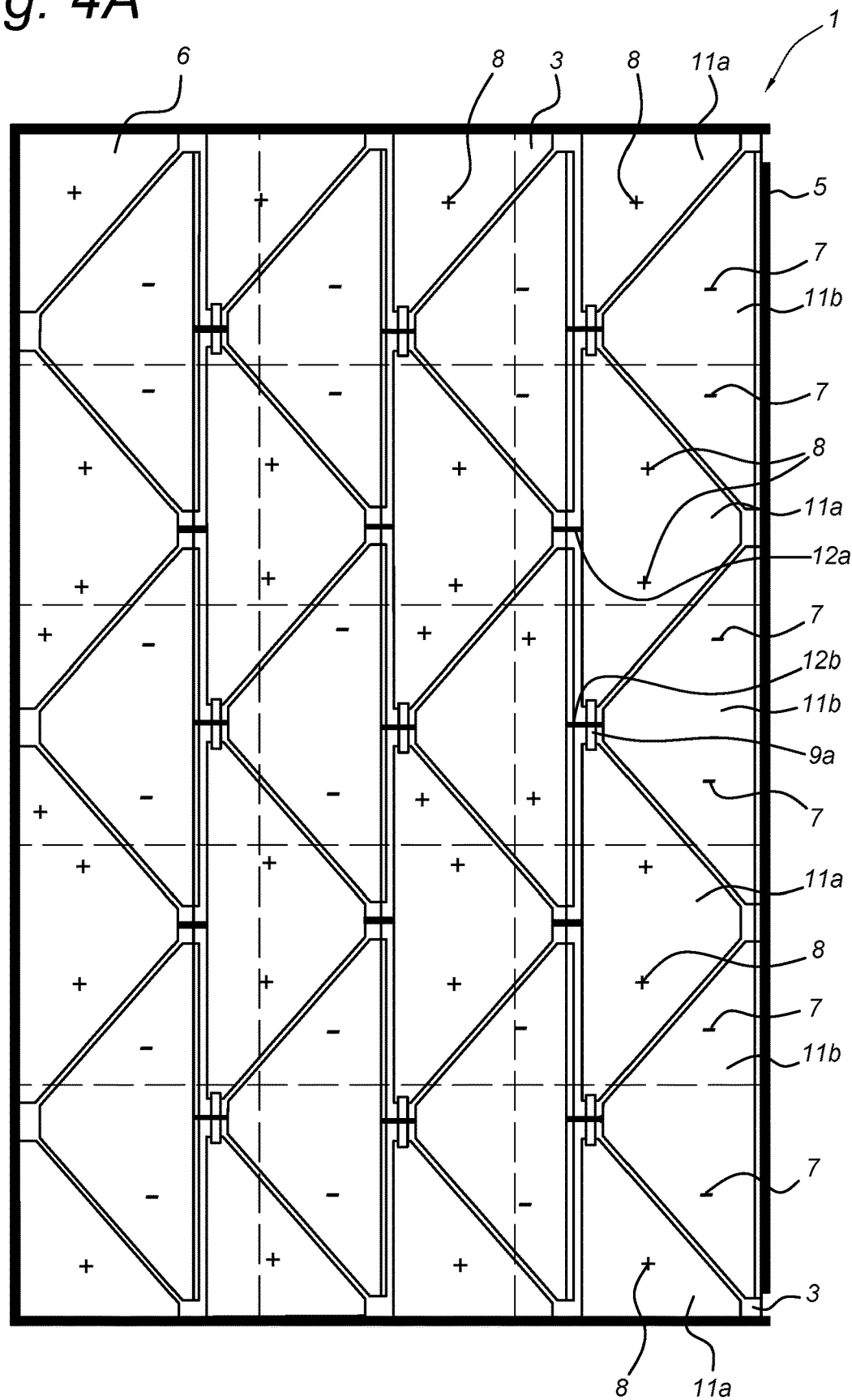
FIG. 4A shows a schematic view of an even further embodiment of a PV module with a back contact substrate according to the present invention.

FIG. 4A shows an alternative embodiment of a PV module 1 having a 3×5 array of PV units 3, and triangle shaped surface elements 11a, 11b. In this embodiment, the triangle shaped surface elements 11a, 11b and line parts 12a, 12b are offset from the 3×5 array of PV units 3, allowing a proper and easy contacting of the positive and negative contact terminals 8, 7 of the underlying PV units 3. Again, in this embodiment, contact bridges 9a may be used to connect the associated conductive parts of the back contact substrate 4. As indicated in the drawing, the positive surface part 6 extends over a left, bottom and top side strip part of the PV module 1, while the negative surface part 5 extends over the right strip part. This allows to provide the PV module terminals 1a, 1b at a multitude of possible locations of the back contact substrate 4.

In an alternative embodiment, the feature is exploited that the positive and negative surface parts 6, 5 (or actually the polygon shaped surface parts 11a, 11b) extend over a large surface (spanning more than one PV unit 3. This allows to have the at least one contact bridge 9a, 9b to be formed by at least two same polarity contact terminals 7, 8 and a cell metallization 8a of a single one of the plurality of photovoltaic units 3. The cell metallization 8a is e.g. (part of) a back side surface of a photovoltaic unit 3.

Figure 4B:
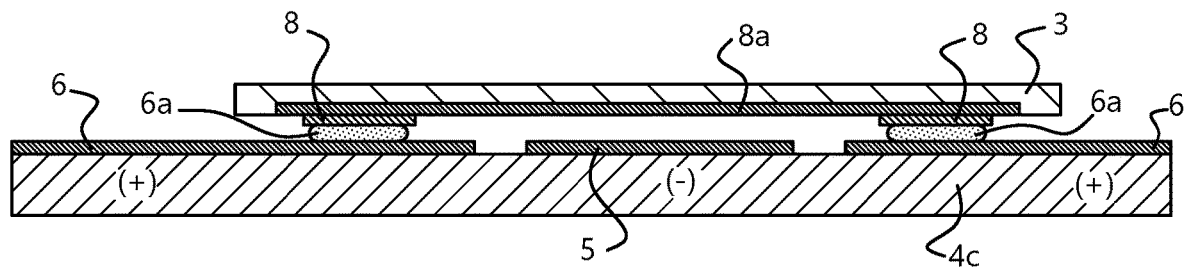
FIG. 4B shows a cross sectional view of a part of an embodiment of a PV module illustrating the use of a cell metallization as part of the contact bridge.

This is illustrated with reference to the cross sectional view in FIG. 4B of a part of an embodiment of a PV module illustrating the use of a cell metallization 8a as part of the contact bridge 9a, 9b. In the cross sectional view of FIG. 4B, a single PV unit 3 is shown, having two contact terminals 8 (of the same polarity) extending from a (back side) cell metallization 8a. The contact terminals 8 are connected to the positive surface part 6 of the back contact substrate 4, e.g. using bonding paste 6a. In this embodiment, the back contact substrate 4 comprises a flexible foil 4c, onto which the positive and negative surface parts 6, 5 are formed, e.g. in the form of a single metal layer deposited onto the flexible foil 4c. Thus, while in this embodiment, the two areas of the positive surface parts 6 are separated by the negative surface part 5, the at least one contact bridge 9a, 9b is formed using the two contact terminals 8 and the cell metallization 8a (and bonding connections 6a).

Figure 4C:
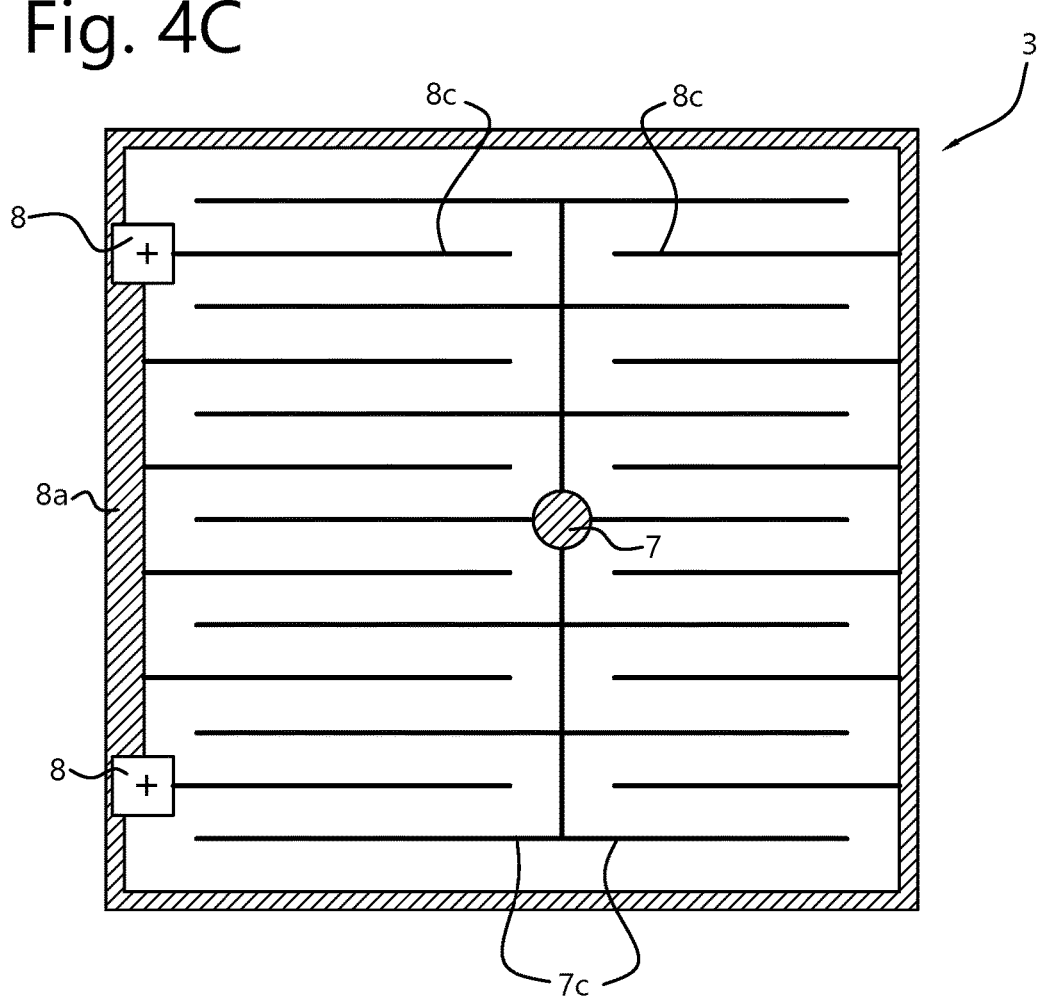
FIG. 4C shows a back side view of an IBC embodiment of a photovoltaic unit 3 use of a cell metallization as part of the contact bridge.

A further embodiment of such an implementation of the at least one contact bridge 9a, 9b using a cell metallization 8a is illustrated with reference to the exemplary embodiment of a photovoltaic unit 3 as shown in the back side view of FIG. 4C. This exemplary embodiment is an interdigitated back contact (IBC) photovoltaic unit 3, wherein negative and positive terminal fingers 7c, 8c are formed on a back side of a photovoltaic unit 3. The positive terminal fingers 8c form part of a back side cell metallization 8a which also includes a circumferential area of the back side of the photovoltaic unit 3. A negative contact terminal 7 is provided in the middle part of the photovoltaic cell 3, and two positive contact terminals 8 are provided at the left side of the photovoltaic cell 3. This allows to make a similar arrangement for the at least one contact bridge 9a, 9b as in the FIG. 4B embodiment, using the two positive contact terminals 8 and the back side metallization 8a.

In the embodiment shown in FIG. 4A the at least one contact bridge 9a, 9b may e.g. be implemented by having two positive contact terminals 8 within the area of the underlying PV units 3 in each of the surface areas now designated as contact bridge 9a. Even though the needed electrical crossings are not possible in a single layer back contact substrate 4, the underlying PV units 3 (or PV cells 2) may implement this feature, as they can be designed with a proper positioned additional contact terminal 7, 8 to provide the contact bridge 9 functionality. In this manner, the associated PV unit 3/PV cell 2 remains functional as photovoltaic generator, and obtains a second function of providing the contact bridge 9a, 9b.

It is noted that in the embodiments of the present invention, the type of PV cell 2 used to form the PV units 3 is irrelevant. The PV cell 2 is e.g. a metal wrap through (MWT), an Emitter Wrap Trough (EWT), or an Interdigitated Back Contact (IBC) type.

When as indicated in the FIG. 4A embodiment, all contact bridges 9a are present, it is again possible to provide a grid like contacting structure, which also provides a good electrical conduction towards the module terminals 1a, 1b. E.g. a well performing contact bridge will have contact with a 1 mΩ resistance, and a metallization resistance of 3 mΩ, which is a total of 5mΩ. It is noted that this contact bridge 9a, 9b will dissipate power according to Dissipation: $P=I^2*R$. For a 2A current this seems negligible (20 mW), but if a 10A current would need to be conducted over a single contact bridge 9a, 9b the dissipation would be too much (500 mW). The grid like structure as described above would solve this problem, as a good and redundant routing is present which will prevent current crowding. In a generic embodiment with this effect, the PV module 1 further comprises a positive terminal 1a electrically connected to the positive surface part 6, and a negative terminal 1b electrically connected to the negative surface part 5, wherein the positive surface part 6 and/or negative surface part 5 comprises multiple conductive paths towards the associated positive and negative terminal 1a, 1b, respectively.

Figure 6:
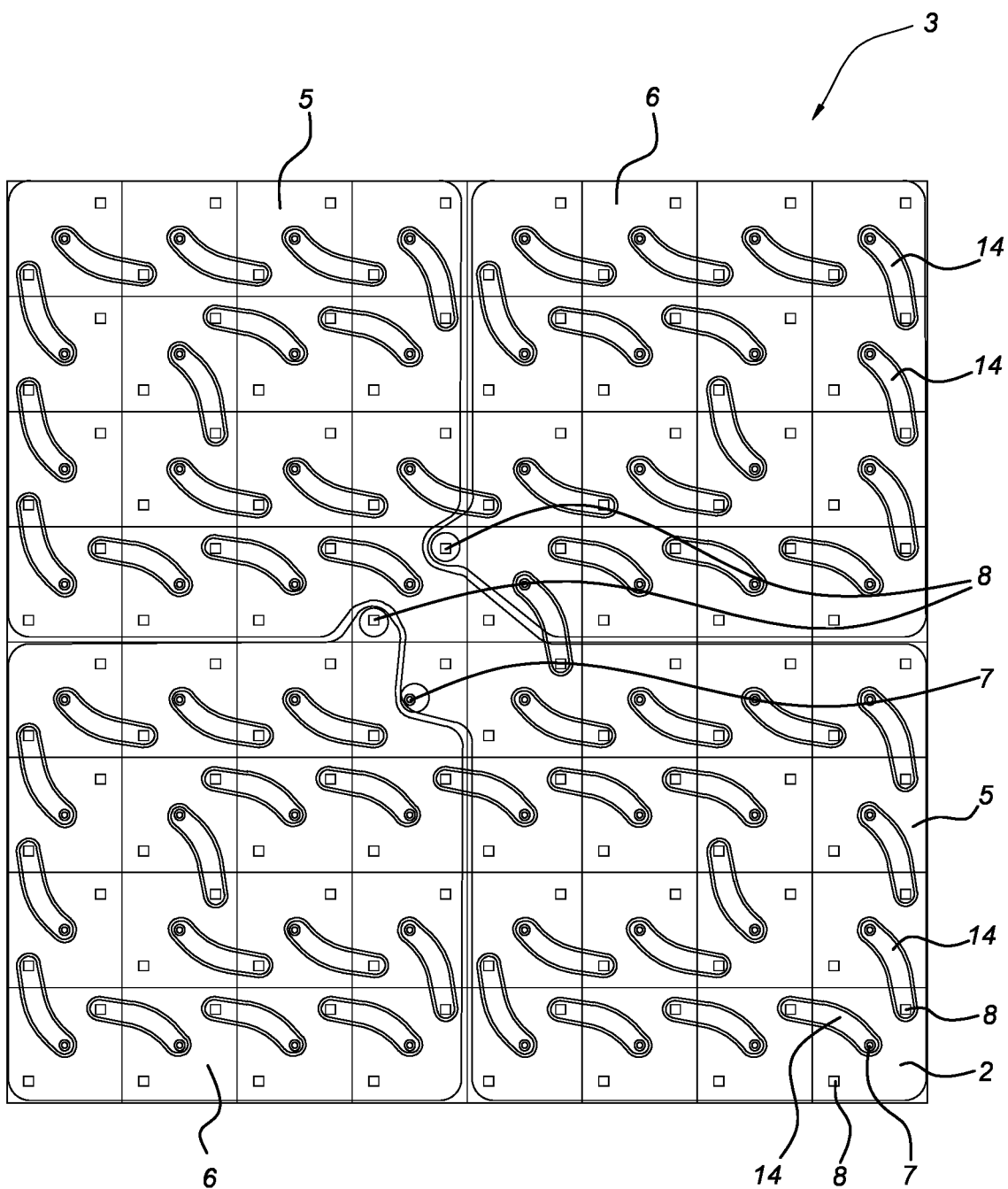
FIG. 6 shows a schematic view of a back contact substrate embodiment for the array of PV cells of FIG. 5.

In a further group of embodiments, the specific use of a single layer back contact substrate 4 is exploited. As mentioned above, FIG. 5 shows a schematic view of a PV unit 3 having an 8×8 array of PV cells 2, which are connected in a string fashion between a single positive contact terminal 8 and negative contact terminal 7. FIG. 6 shows a schematic view of the layout of the back contact substrate 4 of such a PV unit 3 (with the separate PV cells and their individual contact terminals shown. The series connection between all 64 PV cells 2 is provided by connection islands 14 in the back contact substrate. In general terms, the FIG. 6A embodiment relates to a photovoltaic module, wherein the plurality of photovoltaic units 3 comprises parallel circuits of two or more arrays of n×m series connected photovoltaic cells 2, n and m being integer numbers (e.g. n and m are integer numbers larger than 2, n=m=8 for the embodiment shown). A string of series connected photovoltaic cells 2 in a photovoltaic unit 3 has associated series connections between contact terminals 7; 8 of the n×m series connected photovoltaic cells 2, provided by connection islands 14 in the single layer back contact substrate 4 surrounded by parts of the single layer back contact substrate 4 forming the negative surface part 5 and/or the positive surface part 6. The at least one contact bridge 9a, 9b comprises one contact bridge 9a, 9b for each of the two or more photovoltaic units 3. Such a PV unit 3 having 64 PV cells 2 would be able to generate 16 W (0.5 A/32V), using the small connection islands 14 in the back contact substrate 4. The remainder of the back contact substrate can then be used to form a positive surface part 6 and a negative substrate part 5.

It is noted that the back contact substrate 4 may, next to the negative substrate part 5 and positive substrate part 6, comprise one or more additional surface parts, e.g. with another voltage level. In one embodiment these additional surface parts are provided in parallel to a separation line separating the negative and positive substrate parts 5, 6, allowing for a proper positioning of the at least one contact bridge 9a, 9b, In the embodiment shown, the negative surface part 5 of the single layer back contact substrate 4 is a single electrically conducting surface spanning the photovoltaic module 1 surface. The at least one contact bridge 9a, 9b is provided for the positive surface part 6 only, in the embodiment shown between two positive terminals 8 of the PV cell 2 on row 4 and column 4. In other words, the back contact surface 4 comprises multiple connection islands 14, arranged to provide the string connection between all 64 PV cells, a single negative surface part 5 connected to the negative contact terminal 7 of the last PV cell 2 in the string, and a two-part positive surface part 6, of which both parts are connected to one of the two positive contact terminals 8 of the first PV cell 2 in the string. Note that for reasons of manufacturing, all PV cells 2 in this embodiment are provided with one negative contact terminal 7 and two positive contact terminals 8, while for only one of the PV cells 2 both positive contact terminals 8 are actually used.

Of course, also the opposite arrangement can be an embodiment, wherein the positive surface part 6 of the single layer back contact substrate 4 is a single electrically conducting surface spanning the photovoltaic module 1 surface, and the at least one contact bridge 9b is provided for the negative surface part 5 only. The contact bridges are then only provided in the negative surface part of the back contact substrate 4.

Figure 7:
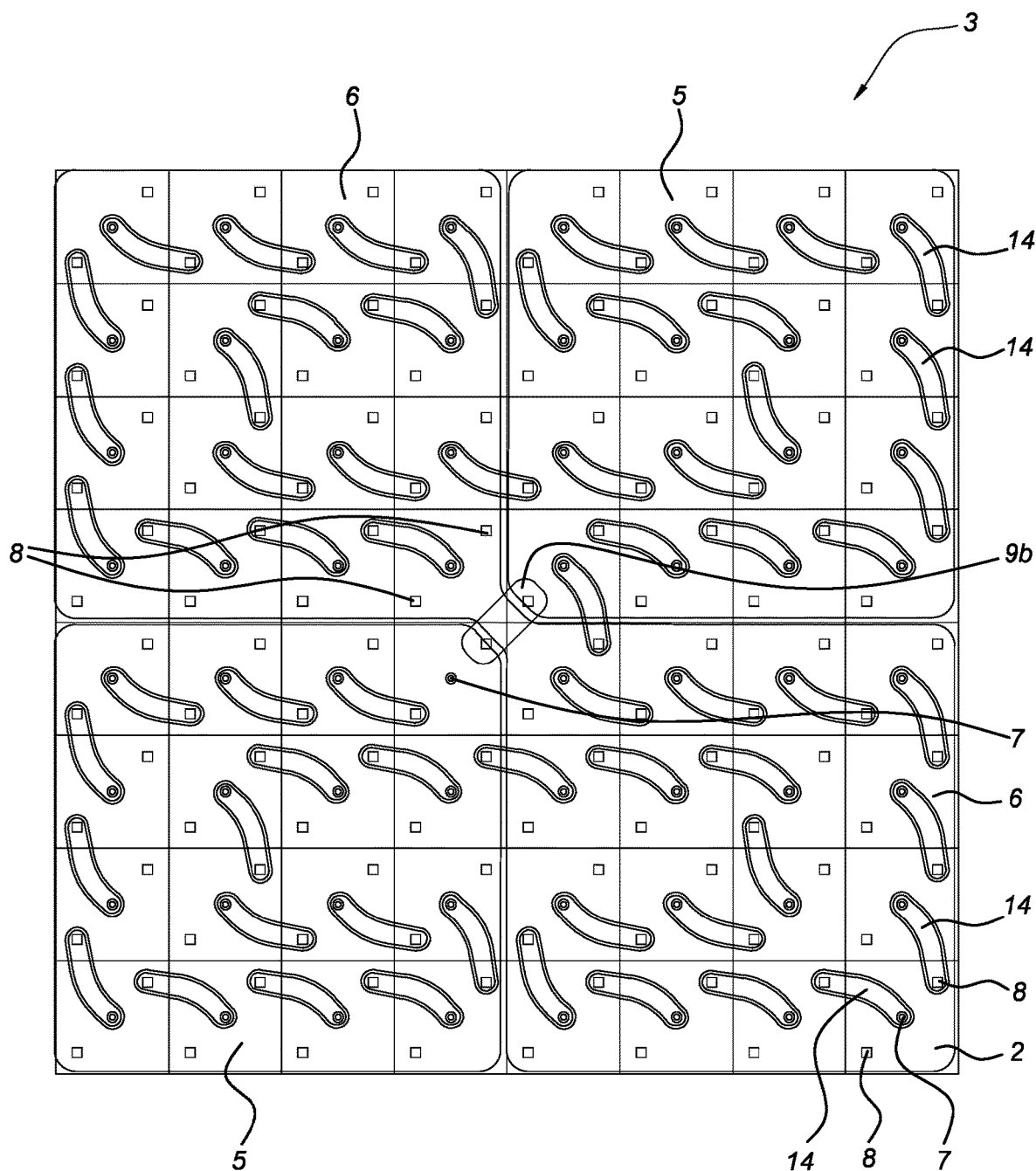
FIG. 7 shows a schematic view of an alternative embodiment for a back contact substrate for the array of PV cells of FIG. 5.

In FIG. 7, such a further alternative embodiment is shown of the PV unit 3 of FIG. 6. In this embodiment, the positive surface part 6 is a single electrically connected surface part of the back contact substrate 4, connected to the positive contact terminal 8 of the first PV cell 2 in the string forming the PV unit 3. The negative surface part 5 (connected to the negative contact terminal 7 of the last PV cell 2 in the string forming the PV unit 3) is divided in two sub-parts, which are interconnected using the embodiment wherein the contact bridge 9b is a separate electrically conductive connection member, e.g. in the form of a patch connection between the two sub-parts of the negative surface part 5. It is noted that the contact bridge 9b is isolated from the terminal contacts of any underlying PV cells 2.

Figure 8:
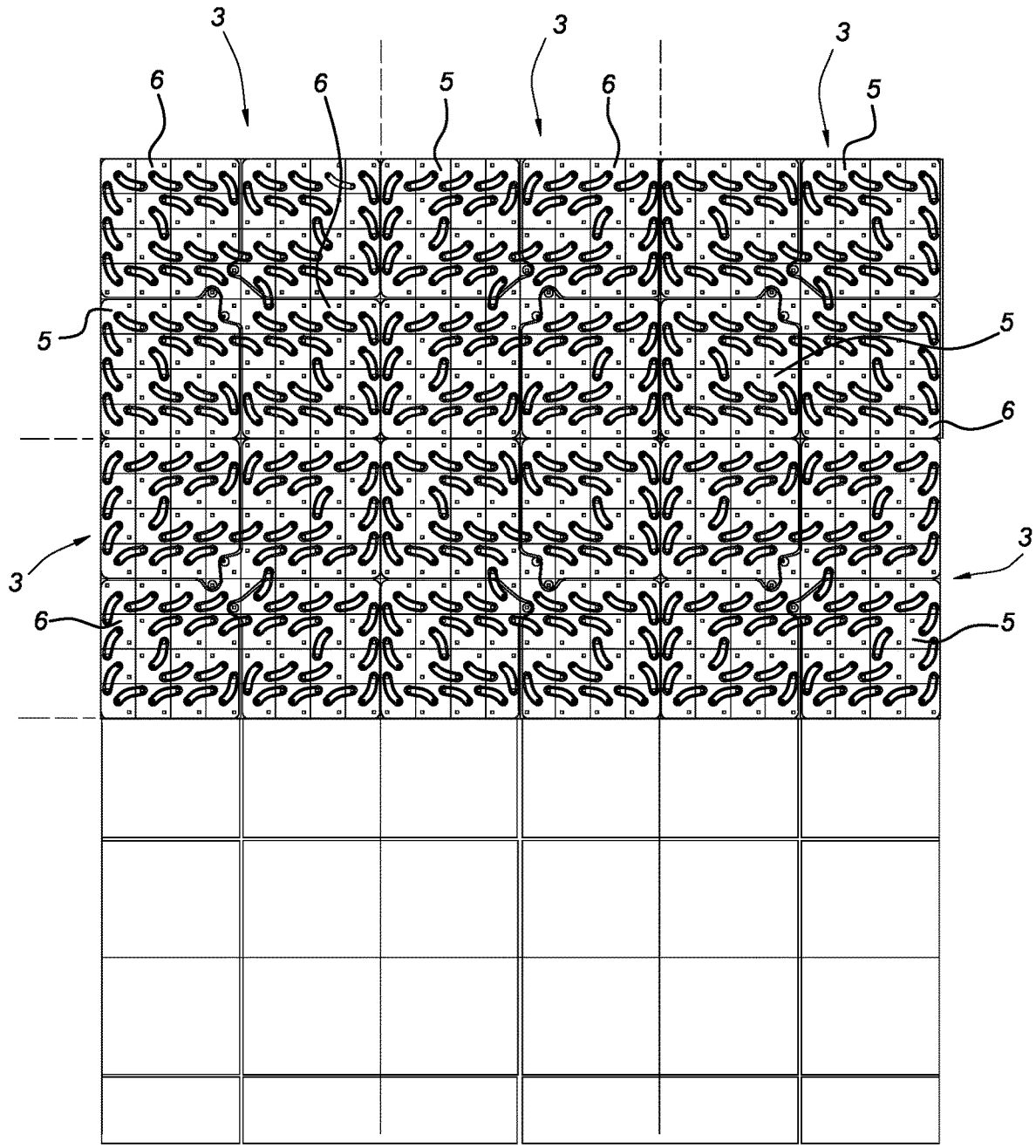
FIG. 8 shows a schematic view of an embodiment of a PV module having a plurality of arrays of PV cells of FIGS. 5 and 6.

Note that in this embodiment the smallest width of the positive surface part (i.e. underneath the contact bridge 9b), is about equal to the width of the contact bridge 9b itself. When combining a number of PV units 3 into a PV module 1, the edges of the positive and negative surface parts 6, 5 are aligned, and provide the electrical parallel circuit connection between the PV units 3. This is exemplified in the partial view of a PV module in FIG. 8, wherein 3×2 arrays of PV units 3 are combined in a PV module 1. Note that the orientation of the PV units 3 is rotated appropriately in order to allow the parallel connection using the positive and negative surface parts 6, 5. As in the embodiments described above, the grid like connection wherein the positive surface part 6 and/or negative surface part 5 comprises multiple conductive paths towards the associated positive and negative terminal 1a, 1b, respectively, a proper distribution of currents is provided, thus preventing any possible current crowding effects.

The present invention has been described above with reference to a number of exemplary embodiments as shown in the drawings. Modifications and alternative implementations of some parts or elements are possible, and are included in the scope of protection as defined in the appended claims.

The invention claimed is:

1. A photovoltaic module comprising a plurality of photovoltaic units each having a positive contact terminal and a negative contact terminal, and a single layer back contact substrate,
   wherein the single layer back contact substrate comprises
   a positive surface part electrically connected to the positive contact terminal of each of the plurality of photovoltaic units,
   a negative surface part electrically connected to the negative contact terminal of each of the plurality of photovoltaic units, and
   the photovoltaic module further comprising at least one contact bridge in a layer of the photovoltaic module overlaying the single layer back contact substrate, the at least one contact bridge providing an electrical connection between two electrically separated sub-parts of the negative surface part or between two electrically separated sub-parts of the positive surface part, the contact bridge crossing a sub-part of opposite polarity between said two electrically separated sub-parts,
   the photovoltaic module further comprising a positive terminal electrically connected to the positive surface part, and a negative terminal electrically connected to the negative surface part, wherein the positive surface comprises multiple positive conductive paths from one of the photovoltaic units towards the associated positive terminal and the negative surface part comprises multiple negative conductive paths from said one of the photovoltaic units towards the associated negative terminal, wherein the multiple positive conductive paths are separated laterally by at least one other photovoltaic unit, and wherein the multiple negative conductive paths are separated laterally by at least one other photovoltaic unit.

2. The photovoltaic module according to claim 1, wherein each of the photovoltaic units comprises a single photovoltaic cell.

3. The photovoltaic module according to claim 1, wherein each of the photovoltaic units comprises a string of photovoltaic cells.

4. The photovoltaic module according to claim 1, wherein the at least one contact bridge is located within a perimeter of the PV module.

5. The photovoltaic module according to claim 1, wherein the at least one contact bridge is formed by at least two same polarity contact terminals and a cell metallization of a single one of the plurality of photovoltaic units.

6. The photovoltaic module according to claim 1, wherein each photovoltaic unit of the plurality of photovoltaic units comprises an n×m array of series connected photovoltaic cells, n and m being integer numbers, and wherein the plurality of photovoltaic units are connected in parallel,
   wherein the series connected photovoltaic cells in a photovoltaic unit of the plurality of photovoltaic units has associated series connections between contact terminals of the n×m series connected photovoltaic cells provided by connection islands in the single layer back contact substrate individually surrounded by parts of the single layer back contact substrate forming the negative surface part and/or the positive surface part;
wherein the at least one contact bridge comprises one contact bridge for each of two or more photovoltaic units of the plurality of photovoltaic units.

7. The photovoltaic module according to claim 1, wherein the at least one contact bridge comprises an electrically conductive connection member.

8. The photovoltaic module according to claim 7, wherein the electrically conductive connection member overlays the single layer back contact substrate.

9. The photovoltaic module according to claim 1, wherein the negative surface part of the single layer back contact substrate is a single electrically conducting surface spanning the photovoltaic module surface, and the at least one contact bridge is provided for the positive surface part only.

10. The photovoltaic module according to claim 1, wherein the positive surface part of the single layer back contact substrate is a single electrically conducting surface spanning the photovoltaic module surface, and the at least one contact bridge is provided for the negative surface part only.

11. The photovoltaic module according to claim 1, wherein each one of the plurality of photovoltaic units is a rectangular cell.

12. The photovoltaic module according to claim 1, wherein the negative surface part and/or the positive surface part comprise a plurality of polygon shaped surface elements.

13. The photovoltaic module according to claim 12, wherein the polygon shaped surface elements are interconnected by a line part in the single layer back contact substrate or by the at least one contact bridge.

14. The photovoltaic module according to claim 1, wherein the plurality of photovoltaic units is arranged in a pattern in which positive contact terminals of four adjacent photovoltaic units of the plurality of photovoltaic units are arranged in a positive terminal group and negative contact terminals of four adjacent photovoltaic units are arranged in a negative terminal group, and positive and negative grid lines are arranged in an intermeshed pattern positioned in the single layer back contact substrate, wherein no grid line of one polarity is interrupted by a grid line of the other polarity.

15. The photovoltaic module according to claim 1, wherein the contact bridge is an electrically conductive connection member in the form of one selected from a wire, a tab and a thin film conductive sheet.

16. The photovoltaic module according to claim 1, wherein the electrical connection between two electrically separated sub-parts of the negative surface part or between two electrically separated sub-parts of the positive surface part, is ohmic.

17. The photovoltaic module according to claim 1, wherein the positive contact terminal and the negative contact terminal are arranged on a back side of each of the plurality of photovoltaic units, wherein the back side of the each of the plurality of photovoltaic units is configured to be in contact with the single layer back contact substrate.

18. The photovoltaic module according to claim 1, wherein each of the plurality of photovoltaic units are is a back surface electrode type photovoltaic unit.

* * * * *